United States Patent
Micallef

(10) Patent No.: US 8,334,450 B2
(45) Date of Patent: Dec. 18, 2012

(54) SEEBECK SOLAR CELL

(76) Inventor: Joseph A. Micallef, Chevy Chase, MD (US)

( * ) Notice: Subject to any disclaimer, the term of this patent is extended or adjusted under 35 U.S.C. 154(b) by 1730 days.

(21) Appl. No.: 11/469,885

(22) Filed: Sep. 4, 2006

(65) Prior Publication Data

US 2008/0053514 A1    Mar. 6, 2008

(51) Int. Cl.
*H01L 35/00*   (2006.01)
*H01L 31/00*   (2006.01)

(52) U.S. Cl. ........ 136/206; 136/239; 136/240; 136/253; 136/259; 136/262

(58) Field of Classification Search ............. 136/206, 136/239, 240, 253, 262, 259
See application file for complete search history.

(56) References Cited

U.S. PATENT DOCUMENTS

| | | | |
|---|---|---|---|
| 3,564,860 A * | 2/1971 | Reich et al. | 62/3.7 |
| 4,710,588 A * | 12/1987 | Ellion | 136/206 |
| 5,936,193 A * | 8/1999 | Parise | 136/205 |
| 6,376,763 B2 | 4/2002 | Funahashi et al. | |
| 6,600,177 B2 | 7/2003 | Dowben | |
| 6,774,013 B2 | 8/2004 | Dowben | |
| 6,846,984 B2 | 1/2005 | Fath et al. | |

OTHER PUBLICATIONS

Vashaee et al, Cross-Plane Seebeck Coefficient Anomaly in a High Barrier Superlattice with Miniband Formation, publication unknown.
Nolas, et al., A Phtoton-Glass-Electron Crystal Approach to Advanced Thermoelectric Energy Conversion Applications, Annu. Rev. Mater. Sci, 1999, 29:89-116.
S.O. Kasap, Thermoelectric Effects in Metals: Thermocouples, published in Web Materials, © 1997-2001.

* cited by examiner

*Primary Examiner* — Basia Ridley
*Assistant Examiner* — Thanh-Truc Trinh

(57) ABSTRACT

A Seebeck solar cell device is disclosed, combining both photovoltaic and thermoelectric techniques. The device may be formed using, for example, a conventional photovoltaic cell formed from a doped silicon wafer. The material used to form conductors to the front and rear regions of the cell are chosen for their thermoelectric characteristics, including the sign, or polarity, of their Seebeck coefficients. The distal portion of each conductor is insulated from the solar and waste heat and, in some embodiments, is also coupled to a cooling mechanism. Multiple such devices can be connected in series or parallel.

20 Claims, 2 Drawing Sheets

SEEBECK SOLAR CELL

BACKGROUND OF THE INVENTION

Alternative energy sources are being given renewed attention due to the high price of oil, environmental concerns associated with hydrocarbon-based technologies and political instability in oil producing areas of the world. One such potential source of energy is solar power. Another is thermoelectric power.

Solar energy, of course, has been the subject of study and of commercial exploitation for some time. A great deal of time and effort has been spent researching how best to convert the sun's energy into power usable in modern society. While many different techniques have been devised, photovoltaic cells are by far the most common and commercially successful. The operation of a photovoltaic cell is well understood. When the cell is exposed to solar radiation it absorbs photons of a certain energy. The photons transfer energy to electrons in the crystal lattice of the silicon. The transferred energy "excites" the electrons into the conduction band, creating the possibility of a flow of charge carriers through electrical contacts coupled to the cell. For purposes of this application, a photovoltaic cell is a device capable of converting photons from the sun into electricity by the generation of charge carriers in a light-absorbing material.

But photovoltaic cells suffer from significant limitations of efficiency. One reason for the inefficiency is the inability of low energy photons to move valence band electrons to the conduction band in the conventional materials used in modern photovoltaic cells. Another related reason is the conversion of much of the solar energy to which the cells are exposed to waste heat. And while research continues into better materials capable of converting more of the available solar energy to electricity, to date only minimal progress has been made in that direction. Thus, a need exists for methods and materials that increase the efficiency of photovoltaic cells.

Another alternative energy source that is only recently coming back into vogue is thermoelectric energy. Almost two centuries ago it was discovered that a temperature gradient in certain materials can create a voltage within the material. The voltage is caused by the diffusion of electrons from a hot region to a cold region, or vice versa. This is the so-called thermoelectric, or Seebeck, effect. During the middle part of the twentieth century the Seebeck Effect was the subject of some research. However, once it was determined that conventional materials possessed only relatively low "figures of merit"—and therefore could create only very small thermoelectric voltages—interest in the phenomenon diminished.

The figure of merit, usually designated "Z", is a quantity describing the thermoelectric characteristics of a certain material as a function of temperature. It is the product of three quantities of a particular material—the electrical conductivity, the inverse of the thermal conductivity and the "Seebeck coefficient"—multiplied by the temperature. It is important to recognize for purposes of the present invention that the Seebeck coefficient can be either positive or negative. The sign, or polarity, of the Seebeck coefficient indicates the "direction" of the voltage created by a temperature gradient, that is, whether the hot side is positive or negative.

The prior art recognized that for conventional materials the non-temperature quantities that comprise the figure of merit for any particular material vary with each other so that it was very rare to identify a material with a figure of merit much greater than 1. Interest in using the thermoelectric effect to generate power therefore diminished. And while more recently interest in developing new materials having higher figures of merit has increased, the successful exploitation of the Seebeck effect in power generation has been very limited. What is required, therefore, is a use of thermoelectric technology that more successfully generates energy.

Combinations of photovoltaic and thermoelectric technology have been attempted in the past, with little or no success. It appears that prior attempts to combine both technologies have not created sufficient power to justify the added expense such systems required, or perhaps simply did not work. In any event, it appears that the art has lost interest in such combinations, and instead appears to be focused on the development of thermoelectric generators outright. What is needed, therefore, is a more efficient and powerful combination of solar and thermoelectric technology.

SUMMARY OF THE INVENTION

The present invention fulfills each of these needs.

A Seebeck solar cell device is disclosed, combining both photovoltaic and thermoelectric techniques in an efficient and powerful way. The device may be formed using, for example, a conventional photovoltaic cell formed from a doped silicon wafer. The material used to form conductors (e.g., contacts or leads) to the front and rear regions of the cell are chosen for their thermoelectric characteristics, including the sign, or polarity, of their Seebeck coefficients. More specifically, a first material having a negative Seebeck coefficient is used to form a conductor to the n-type region of the cell and a second material having a positive Seebeck coefficient is used to form a conductor to the p-type region of the cell. Electrical current is produced not only from the conventional photovoltaic processes, but also from the temperature gradient produced in the conductors due to exposure to solar radiation and to waste heat generated in the photovoltaic cell itself. It is preferred that the distal portion of each conductor is insulated from the solar and waste heat and, in some embodiments, is also coupled to a means for cooling, thereby increasing the temperature gradient. Multiple such devices can be connected in series or parallel.

DETAILED DESCRIPTION OF THE INVENTION

Figure 1:
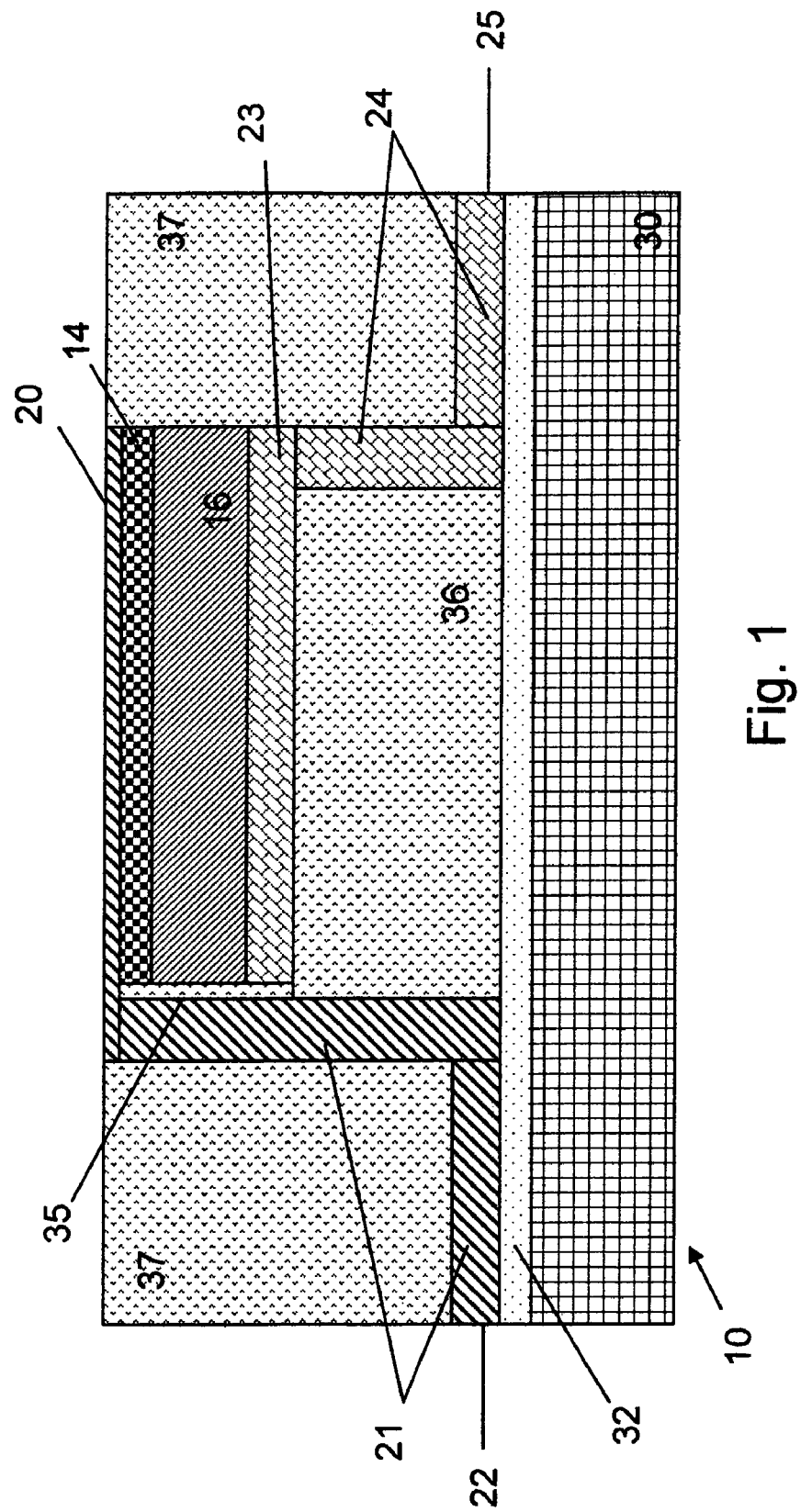
FIG. 1 depicts an exemplary solar cell in accordance with the present invention.

Referring to FIG. 1, an exemplary device 10 in accordance with the present invention is depicted. In that example a conventional photovoltaic cell is formed by diffusing an n-type dopant into one region 14 of a p-type wafer 16. Region 14 will be referred to here as the "front" of the cell because in this example that is the region most directly exposed to solar radiation. Those of ordinary skill in the art will understand that the commercial manufacture of such a cell will require various additional structures, steps and details not described here, such as deposition of an antireflective coating, sintering, a tempered glass front cover and polymer encapsulation. All of these are well-known to the art and therefore are not described in further detail.

Front contact 20 is formed in the upper/front (n-type) region and connected to a first electrical lead 21, having lead end 22. The front contact and first lead are formed in a conventional manner, well-known in the art. In particular, front contact 20 may be formed from several buried contacts positioned in a grid-like manner (not shown) across the face of region 14 and electrically connected together.

In this embodiment of the invention the front contact and first electrical lead are both formed from the same material and that material possesses a negative Seebeck coefficient. Moreover, it is preferable that the material have as high a figure of merit as possible. Nickel is one example of a material possessing a negative Seebeck coefficient, and is also a material which has been used for the formation of front contacts in photovoltaic cells. Bismuth telluride is another example of a suitable material that has been used in that manner in the art, and one that has a higher figure of merit than nickel. Silicon germanium and other telluride compounds are also suitable.

A full area rear contact 23 is formed along the rear side (p-type) of the wafer and connected to a second electrical lead 24, having a rear lead end 25. The rear contacts and second lead are formed in a conventional manner, well-known in the art. In this embodiment of the invention the rear contact and second electrical lead are formed from the same material and that material possesses a positive Seebeck coefficient. Boron carbide is one example of such a material. Copper and molybdenum are other examples.

The distal portions of the leads 21 and 24 are placed in thermal contact with a cooling mechanism, such as a heat sink or heat pipe, and there from electrically connected to a load (not shown). The leads are electrically insulated from the cooling mechanism by a thermally conductive adhesive layer 32, such as a tape or resin as is conventional. Additional insulating layer 35 is formed to electrically insulate lead 21 from the p-regions of the wafer 16. Insulating layer 36 is formed to thermally and electrically insulate the rear contact from the cooling mechanism and to electrically insulate the leads from each other. Insulating layers 37 are formed to thermally and electrically insulate the interior portions of cell 10 from the external world. These insulating layers are formed using conventional techniques and materials.

Front contact 20 is exposed to the sun and therefore in operation will increase in temperature. Lead end 22 and the portions of first electrical lead 21 near it, however, are in thermal contact with cooling mechanism 30 and hidden from the sun's energy by insulating material 37. In operation, therefore, a temperature difference is created between contact 20 and lead end 22, thereby creating a diffusion of charge carriers due to the thermoelectric, or Seebeck, effect. Because contact 20 and lead 21 are formed of a material having a negative Seebeck coefficient, the flow of electrons within those structures will be from the "hot" end (contact 20) to the "cold" end (lead end 22), which is the same direction as the flow of electrons from the conduction band of n-region 14 pursuant to the conventional photovoltaic processes.

Similarly, rear contact 23 is thermally insulated from the cooling mechanism 30, thereby trapping waste heat from the wafer in that contact and causing the temperature of the contact to rise. That rise in temperature will assist in creating a temperature differential between the contact 23 and the lead end 24, which is not in direct thermal contact with wafer 16 but is in thermal contact with cooling mechanism 30. This causes a difference in temperature between contact 23 and lead end 25 (and the portions of lead 24 near lead end 25). Because contact 23 and lead 24 are formed of a material having a positive Seebeck coefficient, the flow of electrons within those structures will be from the cold end (lead end 25) to the hot end (contact 23), which is the same direction as the flow of electrons into wafer 16 pursuant to the conventional photovoltaic processes.

It should be noted that the device described above and depicted in FIG. 1 is merely an example offered to explain the invention. Many variations are possible within the scope of the invention defined in the claims. One such variation would embrace a photovoltaic cell formed by diffusing a p-type dopant into one region of an n-type wafer. In that case, however, the materials selected for the front and rear contacts would have Seebeck coefficients of the opposite polarity than those described with respect to FIG. 1. Another variation would involve formation of the conductors coupled to either the anode or cathode portion of the cell from more than one material. For example, the contact 20 might be formed of a first material and lead 21 from a second. In that case, however, the two materials must each have a Seebeck coefficient of the same polarity.

The invention can be applied to any of a number of different types of photovoltaic cells, including first, second and third generation cells. This includes, but is not limited to, conventional p-n junction cells of various materials including doped silicon or gallium arsenide devices, multi-layer cells or configurations employing special dyes, organic polymers or quantum dots.

Figure 2:
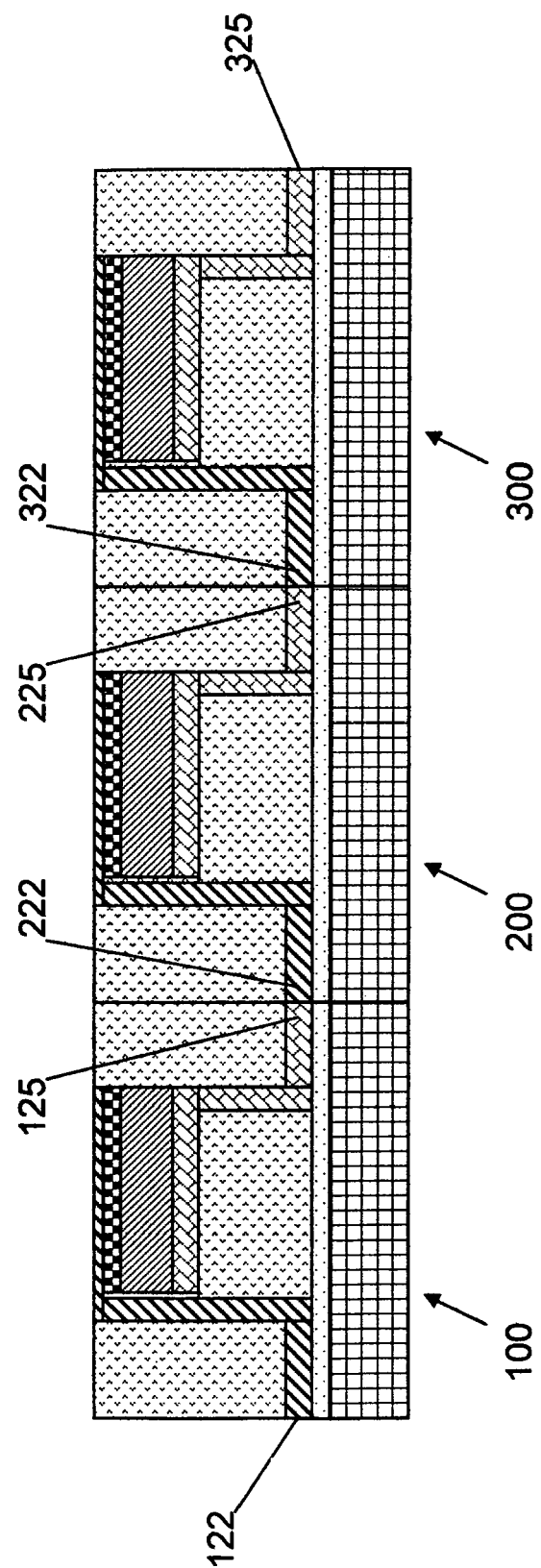
FIG. 2 depicts several exemplary solar cells in accordance with the present invention and connected in a series configuration.

Referring now to FIG. 2, the invention can be employed in a series configuration of multiple cells. FIG. 2 depicts cells 100, 200 and 300 that, in this example, are similar in structure and operation to cell 10 of FIG. 1. Cells 100, 200 and 300 are connected in a series configuration in that the cathode of one cell is electrically connected to the anode of its neighboring cell. Thus, rear lead end 125 of cell 100 is connected to front lead end 222 of cell 200. And rear lead end 225 of cell 200 is connected to front lead end 322 of cell 300. Lead ends 122 and 325 are available to be connected to a load (not shown).

Of course, FIG. 2 depicts three cells in this configuration for purposes of clarity. Those of ordinary skill in the art will recognize that other numbers of cells may be so joined. Also, note that FIG. 2 depicts each cell 100, 200 and 300 with a separate cooling mechanism. However, in this configuration a single cooling mechanism across many cells may be employed.

A plurality of the solar cells of the present invention may also be electrically connected in parallel. In this configuration (not shown) conductors coupled to the cathode of each such cell are electrically connected together and the conductors coupled to the anode of each such cell are also electrically connected together. Such electrical connection of photovoltaic cells is well known to those of ordinary skill in the art and will therefore not be further described.

The invention has been described by use of the examples described above. Nothing in the specification should be interpreted to limit the scope of the invention beyond what is recited in the claims.

I claim:

1. A solar cell apparatus, comprising:
   a photovoltaic cell having a first region above a second region;
   a first conductor formed of a first thermoelectric material and coupled to said first region, said first thermoelectric material having a thermoelectric coefficient of a first polarity; and
   a second conductor formed of a second thermoelectric material and coupled to said second region, said second thermoelectric material having a thermoelectric coefficient of a second polarity.

2. The apparatus of claim 1, wherein said first thermoelectric material is bismuth telluride.

3. The apparatus of claim 1, wherein said second thermoelectric material is boron carbide.

4. The apparatus of claim 2, wherein said second thermoelectric material is boron carbide.

5. The apparatus of claim 1 further comprising a means for cooling.

6. The apparatus of claim 1, wherein either said first or said second conductor is further formed of a third thermoelectric material.

7. The apparatus of claim 1, wherein said first conductor is further formed of a third thermoelectric material and said second conductor is further formed of a fourth thermoelectric material.

8. The apparatus of claim 1, wherein said photovoltaic cell comprises a means for charge carrier generation.

9. The apparatus of claim 1, wherein said photovoltaic cell is a gallium arsenide cell.

10. The apparatus of claim 1 connected in parallel to a second photovoltaic cell.

11. A photovoltaic apparatus, comprising:
a plurality of photovoltaic cells each of which includes a first region above a second region and each electrically connected in series, wherein a cathode of a first of said photovoltaic cells is coupled to an anode of a second of said photovoltaic cells by a first conductor formed of a first thermoelectric material and by a second conductor formed of a second thermoelectric material, wherein said first thermoelectric material has a thermoelectric coefficient of a first polarity and said second thermoelectric material has a thermoelectric coefficient of a second polarity.

12. The apparatus of claim 11, wherein said first thermoelectric material is bismuth telluride.

13. The apparatus of claim 11, wherein said second thermoelectric material is boron carbide.

14. The apparatus of claim 12, wherein said second thermoelectric material is boron carbide.

15. The apparatus of claim 11, wherein said first thermoelectric material is a telluride compound.

16. The apparatus of claim 11 further comprising a means for cooling.

17. A method of fabricating a photovoltaic apparatus, comprising the steps of:
forming a photovoltaic cell having a first region above a second region and a cathode and an anode;
forming a first conductor for coupling to said cathode, said first conductor formed of a first thermoelectric material having a thermoelectric coefficient of a first polarity;
forming a second conductor for coupling to said cathode, said second conductor formed of a second thermoelectric material having a thermoelectric coefficient of a second polarity.

18. The method of claim 17, wherein the step of forming said first conductor includes forming said first conductor from a third thermoelectric material.

19. The method of claim 17, wherein the step of forming said second conductor includes forming said second conductor from a third thermoelectric material.

20. The method of claim 18, wherein the step of forming said second conductor includes forming said second conductor from a fourth thermoelectric material.

\* \* \* \* \*